(12) United States Patent
Huber et al.

(10) Patent No.: US 9,074,108 B2
(45) Date of Patent: *Jul. 7, 2015

(54) POTTING COMPOUND SUITABLE FOR POTTING AN ELECTRONIC COMPONENT

(75) Inventors: Jürgen Huber, Erlangen (DE); Lothar Schön, Neunkirchen (DE); Matthias Übler, Ursensollen (DE)

(73) Assignee: Siemens Aktiengesellschaft, München (DE)

( * ) Notice: Subject to any disclaimer, the term of this patent is extended or adjusted under 35 U.S.C. 154(b) by 0 days.

This patent is subject to a terminal disclaimer.

(21) Appl. No.: 13/701,509

(22) PCT Filed: May 13, 2011

(86) PCT No.: PCT/EP2011/057766
§ 371 (c)(1),
(2), (4) Date: Mar. 1, 2013

(87) PCT Pub. No.: WO2011/151153
PCT Pub. Date: Dec. 8, 2011

(65) Prior Publication Data
US 2013/0169277 A1    Jul. 4, 2013

(30) Foreign Application Priority Data
Jun. 2, 2010 (DE) .......................... 10 2010 022 523

(51) Int. Cl.
*C09D 147/00* (2006.01)
*G01R 33/385* (2006.01)
*H01F 5/06* (2006.01)
(Continued)

(52) U.S. Cl.
CPC ............ *C09D 147/00* (2013.01); *C08K 3/0058* (2013.01); *C08K 5/0066* (2013.01); *H01F 41/127* (2013.01); *G01R 33/3858* (2013.01); *H01F 5/06* (2013.01); *G01R 33/385* (2013.01)

(58) Field of Classification Search
USPC ......................... 600/407–435; 382/128–131; 324/300–322; 252/500; 106/287.35; 523/205
See application file for complete search history.

(56) References Cited

U.S. PATENT DOCUMENTS 5,235,283 A    8/1993  Lehne et al.
6,441,614 B1   8/2002  Edelstein et al.
(Continued)

FOREIGN PATENT DOCUMENTS

DE   10 2009 053 965 A1   6/2001
DE          10345139 A1   4/2005
(Continued)

OTHER PUBLICATIONS

German Office Action dated Dec. 29, 2010 for corresponding German Patent Application No. DE 10 2010 022 523.1-43 with English translation.

(Continued)

*Primary Examiner* — Patrick Assouad
*Assistant Examiner* — Tiffany Fetzner
(74) *Attorney, Agent, or Firm* — Lempia Summerfield Katz LLC

(57) ABSTRACT

The invention relates to a potting compound suitable for potting an electronic component, in particular a large-volume coil such as a gradient coil, consisting of a supporting matrix in which at least one filler made of polymer nanoparticles is distributed. At least one filler (11) that is used as a flame retardant is introduced into the supporting matrix (8).

22 Claims, 1 Drawing Sheet

(51) Int. Cl.
*C08K 3/00* (2006.01)
*C08K 5/00* (2006.01)
*H01F 41/12* (2006.01)

(56) References Cited

U.S. PATENT DOCUMENTS

| | | | |
|---|---|---|---|
| 6,519,822 B1 | 2/2003 | Stelzl et al. | |
| 6,642,717 B2* | 11/2003 | Dietz et al. | 324/318 |
| 7,154,270 B2 | 12/2006 | Arz et al. | |
| 7,190,170 B1 | 3/2007 | Seeber et al. | 324/411 |
| 7,297,375 B2 | 11/2007 | Wegner et al. | |
| 7,560,145 B2 | 7/2009 | Ouchi et al. | |
| 7,790,798 B2* | 9/2010 | Chen et al. | 524/492 |
| 7,888,419 B2* | 2/2011 | Cooper et al. | 524/445 |
| 7,955,661 B2 | 6/2011 | Stevens et al. | |
| 8,030,818 B2 | 10/2011 | Nelson et al. | |
| 8,217,108 B2* | 7/2012 | Cooper et al. | 524/445 |
| 8,305,174 B2 | 11/2012 | Groeppel et al. | |
| 8,343,270 B2* | 1/2013 | Jennrich et al. | 106/287.35 |
| 8,487,019 B2 | 7/2013 | Nelson et al. | |
| 8,866,479 B2 | 10/2014 | Groeppel et al. | |
| 8,889,196 B2* | 11/2014 | Xu | 424/618 |
| 2002/0008516 A1* | 1/2002 | Dietz et al. | 324/318 |
| 2005/0096423 A1 | 5/2005 | Jennrich et al. | |
| 2005/0168222 A1 | 8/2005 | Arz et al. | |
| 2005/0216075 A1* | 9/2005 | Wang et al. | 623/1.15 |
| 2005/0277349 A1 | 12/2005 | Smith et al. | |
| 2007/0026221 A1 | 2/2007 | Stevens et al. | |
| 2007/0106006 A1* | 5/2007 | Cooper et al. | 524/445 |
| 2007/0114704 A1 | 5/2007 | Stevens et al. | |
| 2007/0155861 A1* | 7/2007 | Chen et al. | 523/351 |
| 2007/0191513 A1 | 8/2007 | Jenrich et al. | 523/443 |
| 2008/0119630 A1 | 5/2008 | Bauer et al. | 528/65 |
| 2008/0248201 A1* | 10/2008 | Corkery et al. | 427/256 |
| 2008/0249221 A1* | 10/2008 | Corkery et al. | 524/404 |
| 2008/0284262 A1 | 11/2008 | Nelson et al. | |
| 2009/0242844 A1* | 10/2009 | Elkovitch | 252/500 |
| 2010/0022857 A1 | 1/2010 | Ergeneman et al. | |
| 2010/0265019 A1 | 10/2010 | Groeppel et al. | |
| 2010/0291374 A1 | 11/2010 | Akarsu et al. | |
| 2011/0115488 A1 | 5/2011 | Groeppel et al. | 324/318 |
| 2011/0160345 A1* | 6/2011 | Cooper et al. | 523/466 |
| 2013/0169277 A1* | 7/2013 | Huber et al. | 324/322 |
| 2014/0109386 A1* | 4/2014 | Matthews | 29/592 |
| 2014/0138864 A1* | 5/2014 | Plaumann et al. | 264/19 |
| 2014/0178513 A1* | 6/2014 | Matthews | 425/6 |

FOREIGN PATENT DOCUMENTS

| | | |
|---|---|---|
| DE | 10 2006 062 248 A1 | 7/2008 |
| EP | 1518889 A1 | 3/2005 |
| EP | 1 850 145 A2 | 10/2007 |
| WO | WO2008022614 A2 | 2/2008 |

OTHER PUBLICATIONS

PCT International Preliminary Report on Patentability dated Aug. 8, 2012 for corresponding PCT/EP2011/057766 with English translation.

German Office Action dated Sep. 4, 2014 for corresponding German Patent Application No. DE 10 2010 022 523.1 with English translation.

"Tetrabronnbisphenol A," ROMPP—Georg Thieme Verlag KG, https://roempp.thieme.de/roempp4.0/data/RD-20-00835, Bearbeitet von Ullrich Jahn; pp. 1-2, 2007.

* cited by examiner

POTTING COMPOUND SUITABLE FOR POTTING AN ELECTRONIC COMPONENT

The present patent document is a §371 nationalization of PCT Application Serial Number PCT/EP2011/057766, filed May 13, 2011, designating the United States, which is hereby incorporated by reference. This patent document also claims the benefit of DE 10 2010 022 523.1, filed on Jun. 2, 2010, which is also hereby incorporated by reference.

BACKGROUND

The present embodiments relate to a potting compound.

Large-volume gradient coils of a magnetic resonance device may include three coil sections for generating magnetic field gradients in the three spatial directions (X, Y, Z). The X- and Y-coils are designed as saddle coils, and the Z-coil is implemented by a peripheral winding. The individual coils may be constructed as bundled individual conductors. Separating structures may be developed in an electrically conductive plate (e.g., made from copper or aluminum) using a suitable process, and the remaining material may form the coil winding. The coil windings produced according to the various processes are connected with an electrically insulating support plate and, in a formative act, are formed, for example, as a semi-cylindrical casing. The individual coil layers are mounted in succession on a cylindrical mandrel. Further components of the coil assembly may be insulating and reinforcement layers, one or more cooling layers (e.g., including plastic tubing, through which a coolant such as water flows) and shim coils. Further layers forming the coil assembly are, for example, secondary windings that shield the magnetic field generated by the primary coils from the outside.

The complete coil assembly is encapsulated in a casting resin, for example, based on epoxy resin. All spaces between the conductors are impregnated without cavities or bubbles. The casting resin, which may be a potting compound, has a broad range of properties. These include, for example, a low viscosity during processing, so that all spaces between the conductors are completely impregnated (e.g., free from cavities or bubbles), and a high modulus of elasticity in order to provide a high overall rigidity and thus more accurate positioning of the individual windings. The casting resin may have good thermal conductivity to provide effective transfer of heat from the conductor structures to the cooling layer. The casting resin may have a high heat resistance that is reflected in a high glass transition temperature so that as constant a property profile as possible may be achieved in the operating temperature range. The casting resin may have a low coefficient of thermal expansion (e.g., if possible, similar to the coefficient of thermal expansion of the other materials used (copper conductors, insulation layers)) in order to prevent mechanical stress and thereby a simplified crack formation, which may lead to cracks and peeling in the coil unit when heated both during operation and during the cooling from the curing temperature. In this context, a high crack resistance that is manifest in the form of a high critical stress intensity factor $K_{Ic}$ combined with a high critical fracture energy $G_{Ic}$, should also be mentioned. A high partial discharge resistance, a low dielectric loss factor, flame retardance, and economic aspects should also be mentioned.

Thermally curing epoxy-based casting resins may be used as potting compound for, for example, large-volume coils. This potting compound may contain approximately 65% filler by weight (e.g., in the form of quartz powder, aluminum oxide or wollastonite microparticles). Microparticles provide that the particle size is measured in micrometers. EP 1 850 145 A2 discloses a potting compound or a magnetic coil cast with a potting compound. This potting compound includes microparticular fillers and inorganic nanoparticles. A potting compound with such a composition has very good crack resistance based on the combination of a very high critical stress intensity factor $K_{Ic}$ with a very high critical fracture energy $G_{Ic}$. The fillers used effect some positive changes to the cured potting compound, for example, with regard to heat resistance, crack resistance, thermal conductivity and economic aspects. It would therefore be desirable to implement as high a filler content as possible. There are no specifications included with regard to flame retardance. The potting compound is not a flame-resistant, nanoparticular potting compound.

High filler content causes the flow behavior of the prepared potting compound to be considerably impaired. Furthermore, the type of filler has a significant impact on an actual increase in crack resistance. This is worsened, for example, due to the aluminum oxide trihydrate $Al(OH)_3$ (abbreviated to ATH) that is frequently added for flame retardance reasons. An increase in the glass transition temperature of the base resin mixture that serves as the supporting matrix also causes a worsening of the crack resistance. Fillers tend toward sedimentation or filtration, for example, on the glass fabric layers used for reinforcement. A specific potting resin composition is therefore a compromise between the required properties.

SUMMARY AND DESCRIPTION

With regard to flame retardance, the prior art may not provide a satisfactory solution taking into account the aforementioned properties.

The present embodiments may obviate one or more of the drawbacks or limitations in the related art. For example, a potting compound with excellent mechanical and rheological properties, which additionally offers the possibility of flame retardance, is provided.

A potting compound having at least one filler serving as a flame retardant that is introduced into the supporting matrix is provided.

The potting compound includes a thermally curable supporting matrix that is known, per se (e.g., made from an epoxy resin), and which, after curing has been carried out, thus results in a molding with relatively good mechanical properties. The curing process of the supporting matrix may be accelerated or controlled by the addition of a suitable hardening agent, for example, in the form of special amines.

The supporting matrix is a dispersed system (e.g., fillers are distributed in the supporting matrix). In one embodiment, homogeneously distributed or well dispersed polymer nanoparticles ("p-nano"), to be designated as first fillers, are contained in the supporting matrix.

The fillers positively influence the spectrum of properties of the potting compound with regard to the molding that results after hardening of the potting compound (e.g., with regard to mechanical properties). Thus, the addition of polymer nanoparticles leads to a considerable improvement in the parameters that characterize crack resistance (e.g., the critical stress intensity factor $K_{Ic}$ and the critical fracture energy $G_{Ic}$). The addition of polymer nanoparticles enables these parameters that characterize crack resistance to be significantly improved compared to potting compounds that are filled only with inorganic particles.

The flow behavior (e.g., the rheological properties) is not adversely affected due to the low particle size of the polymer nanoparticles added. The potting compound is extremely free-flowing.

In addition, nanoparticular fillers minimize filtration and sedimentation effects. The nanoparticular fillers penetrate into narrow crevices or into areas already filled with tissues, where an increased filler concentration may occur in these areas. This is an improved property adaption in the highly complex multilayer coil assembly (e.g., with regard to the numerous boundary surfaces). In addition, a more homogeneous distribution of the fillers may be provided within the supporting matrix, providing that the properties of the potting compound are reproducible and thus have a consistent quality. The adhesion to wetted boundary surfaces is also improved by the use of polymer nanoparticles.

In contrast to the prior art, the potting compound also has outstanding flame retardance properties, since at least one filler that is used as a flame retardant (e.g., a secondary filler) is introduced into the supporting matrix. This applies despite the polymer nanoparticles contained in the supporting matrix, which, when viewed in isolation, lead to poorer flame resistance levels due to the large specific surface area. The potting compound has the fire classification standard or flame resistance level relating to the flammability of plastics (e.g., of UL 94 V or UL 94 V-0). The influence of flame retardants, which negatively affects the other properties such as, for example, the cracking behavior, is reduced or eliminated by combining the flame retardants with the polymer nanoparticles. This may lead to an improvement in properties. This will be discussed below.

The potting compound has a property profile in accordance with the requirements outlined above (e.g., with regard to mechanical properties such as crack resistance even at a relatively high glass transition temperature), is extremely free-flowing and is virtually non-flammable or self-extinguishing). The potting compound is an unknown class of material in the field of virtually non-flammable, crack-resistant reaction resin systems or reaction resin molding materials.

These property improvements of the potting compound or of a molding formed from the potting compound affect not only the system loads occurring in the operating temperature range of a gradient coil, for example, but also allow the development of new product innovations (e.g., with regard to more compact designs, integrated functions or increased performance as well as new areas of application) thanks to the particular safety aspect in case of fire.

The filler used as a flame retardant may include particles of aluminum oxide trihydrate ($Al(OH)_3$), magnesium dihydroxide ($Mg(OH)_2$), antimony trioxide ($Sb_2O_3$), of brominated and/or chlorinated compounds, halogenated and/or halogen-free organophosphorous compounds, or a combination thereof. These substances, which restrict, slow or inhibit the spread of fire, may be based on both physical modes of action such as, for example, through evaporation of chemically bonded water, and on chemical modes of action such as, for example, through irtumescence. According to irtumescence, the foaming of a flame retardant causes the formation of an insulating layer preventing the feeding of oxygen. Particles and compounds serving as flame retardants other than the ones described here merely by way of example may also be used.

At least one filler made from inorganic particles (e.g., microparticles) may be distributed in the supporting matrix. Where present, the inorganic particles may be designated as a third filler, where the polymer nanoparticles may replace a proportion of the inorganic particles, thereby, provided the quantity of filler remains the same compared to known potting compounds, resulting in a reduction in the viscosity of the potting compound. In other words, the polymer nanoparticles may be added or substituted. If the original viscosity is sufficient, the inorganic particle content may be increased accordingly. This enables an increase in heat conductivity and a reduction in the coefficient of expansion to be achieved in the potting compound. Because of the polymer nanoparticles contained in the potting compound, even the addition of inorganic particles does not impair the flow behavior.

The inorganic particles may include silicon dioxide ($SiO_2$), aluminum oxide ($Al_2O_3$), aluminum nitride (AlN), calcium magnesium dicarbonate ($CaMg(CO_3)_2$), titanium dioxide ($TiO_2$), boron nitride (BN), iron (III) oxide ($Fe_2O_3$), iron (II, III) oxide ($Fe_3O_4$), zinc oxide (ZnO), silicon carbide (SiC), synthetic ceramics, zeolites, chalk, talc ($Mg_3Si_4O_{10}(OH)_2$), wollastonite ($CaSiO_3$), purely carbon-based particles, or combinations thereof. Both pure substances and composites of the pure substances may be provided. Other inorganic particles may also be used, since the inorganic particles listed above are merely by way of example.

The polymer nanoparticles may, for example, be formed from polybutadiene, polystyrene, polysilane, polysiloxane, elastomers, thermoplastics, hybrid materials, or a combination thereof, or may contain these. The polymer nanoparticles my contain these in the case of particles with a core-shell construction (e.g., particles including a core made from a first material and a surrounding shell made from a second material). Polymer nanoparticles made from a single material as well as different polymer nanoparticles made from at least two different materials may be used. The list is not exhaustive. All types of polymers (e.g., essentially organic nanoparticles) may be used.

The inorganic particles may be present at least in part as nanoparticles. The use of inorganic nanoparticles makes it possible to specifically adjust other parameters of the potting compound. These may contain both polymers (e.g., organic nanoparticles) and inorganic nanoparticles at least in part, and therefore nanoparticular composites of organic and inorganic particles.

The polymer nanoparticles may be unmixed from one material or core-shell particles. The same applies for the inorganic nanoparticles where present. Core-shell particles offer the possibility of combining various functionalities and specifically influencing the properties (e.g., through blending, thickness of the core and shell, and particle size). These materials, which are also defined as hybrid particles, may be manufactured by a process called heterocoagulation, in which the smaller particles are chemically or physically bonded to the surface of the larger ones. Core-shell particles synthesized in this way essentially have a core that has entirely different properties than the shell, resulting in a specific representation of functionalized materials.

In one embodiment, the polymer nanoparticles and/or the inorganic particles may have a surface functionalization (e.g., using silanization). A surface functionalization may be conducive to or may establish the compatibility of the different fillers contained in the supporting matrix. The same applies for the compatibility of the fillers with the supporting matrix. The functionalization of the dispersion (e.g., caused by sterically or electrostatically repellent effects) may be beneficial. Silanization has proved successful for this purpose, though this is mentioned only by way of example.

The average diameter of the polymer nanoparticles and possibly of the inorganic nanoparticles is $\leq 1000$ nm (e.g., $\leq 100$ nm). This essentially applies for each particle shape (e.g., spherical, filament-shaped or plate-like nanoparticles), where in the case of filament-shaped or plate-like nanoparticles, it is not the diameter but the length that is ≤1000 nm (e.g., ≤100 nm).

The content of polymer nanoparticles may be ≤20% by weight (e.g., ≤10% by weight), and the content of particles used as flame retardants is ≤80% by weight (e.g., ≤30% by weight). Insofar as inorganic nanoparticles are also used, the total nanoparticle content may be ≤30% by weight (e.g., not exceeding ≤10% by weight).

The present embodiments also relate to an electronic component potted with the potting compound (e.g., a large-volume coil such as a gradient coil).

DETAILED DESCRIPTION OF THE DRAWINGS

Figure 1:
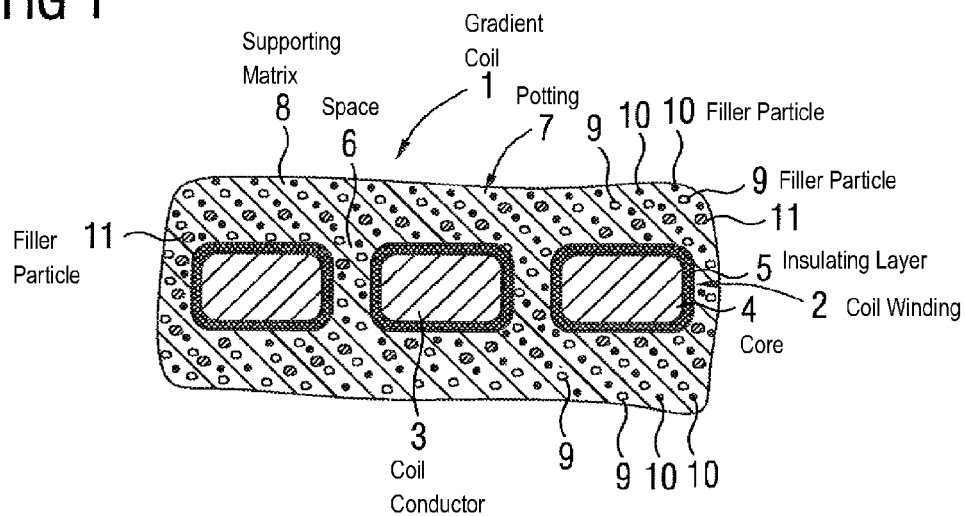
FIG. 1 shows a partial view of one embodiment of a coil in cross-section.

FIG. 1 shows a gradient coil 1 including a plurality of individual coil windings 2 from coil conductors 3 that have, for example, an essentially rectangular cross-section. For illustrative purposes, the coil conductors 3 are shown enlarged. The coil conductors 3 include a core 4 having the conductive material and an insulating layer 5 surrounding the conductive material (e.g., in the form of a paint or thermoplastic layer, or a plastic filament mesh). The coil windings 2 are wound sufficiently tightly, and accordingly, the spaces 6 shown between the individual vertical and horizontal conductor layers are shown enlarged for reasons of clarity and do not correspond to an actual arrangement (e.g., the spaces 6 may be much smaller). Such a gradient coil 1 may have additional layers such as, for example, a cooling layer made from coolant lines that are not shown but are likewise potted. The coil windings 2 are potted with a potting compound 7 or impregnated with the potting compound 7, so that the coil windings 2 are completely embedded in the potting compound 7.

The potting compound 7 includes a supporting matrix 8 (e.g., a modified epoxy resin based on bisphenol A). Other reaction resins with a similar property spectrum may also be used as the supporting matrix 8. Fillers made from inorganic microparticles 9 and fillers made from polymer nanoparticles 10 are distributed in the supporting matrix 8 homogeneously and with good dispersion. The inorganic microparticles 9, at least some of which may also be present in the form of nanoparticles, include, for example, silicon dioxide ($SiO_2$), aluminum oxide ($Al_2O_3$), aluminum nitride (AlN), calcium magnesium dicarbonate ($CaMg(CO_3)_2$), titanium dioxide ($TiO_2$), boron nitride (BN), iron (III) oxide ($Fe_2O_3$), iron (II, III) oxide ($Fe_3O_4$), zinc oxide (ZnO), silicon carbide (SiC), synthetic ceramics, zeolites, chalk, talc ($Mg_3Si_4O_{10}(OH)_2$), wollastonite ($CaSiO_3$), purely carbon-based particles, or combinations thereof.

The polymer nanoparticles 10 include, for example, polybutadiene, polystyrene, polysilane, polysiloxane, elastomers, thermoplastics, hybrid materials, or combinations thereof. The combinations are provided if the polymer nanoparticles 10 are core-shell particles (e.g., particles that have a core made from a first material and a shell surrounding the core made from a second material). In the case of inorganic nanoparticles present in the supporting matrix 8, the inorganic nanoparticles are formed at least in part as core-shell particles.

A proportion of the particles contained in the supporting matrix 8 (e.g., the inorganic microparticles and/or nanoparticles 9 and the polymer nanoparticles 10) may be provided with surface silanization, which is, among other things, conducive to good dispersion of the particles in the supporting matrix 8, while preventing the development of agglomerates. The average particle size of the polymers introduced into the supporting matrix 8, and possibly of inorganic nanoparticles, is between 0.5 nm and 1000 nm (e.g., below 100 nm). Nanoparticles of different sizes may be included in the supporting matrix 8. The morphology of the nanoparticles is largely arbitrary (e.g., different shapes are possible such as spherical and/or elongated). The maximum concentration of blended nanoparticles may not exceed 20% by weight, and a concentration of below 10% by weight may be provided.

The supporting matrix 8 further includes flame retardant filler particles 11 that are formed, for example, from aluminum oxide trihydrate ($Al(OH)_3$), magnesium dihydroxide ($Mg(OH)_2$), antimony trioxide ($Sb_2O_3$) from brominated and/or chlorinated compounds, halogenated and/or halogen-free organophosphorous compounds, or a combination thereof. The potting compound 7 has low flammability and has a flame resistance level according to UL 94 V-0.

The potting compound 7 has an improved property profile compared to the prior art. For example, the crack resistance at a practically unchanged glass transition temperature and adhesion to wetted boundary surfaces are significantly improved. The known, negative influence of flame retardants, for example, on mechanical properties such as, for example, the cracking behavior is reduced or eliminated by the use of core-shell nanoparticles. The potting compound 7 is essentially characterized as being a fire-resistant or low flammability, crack-resistant and extremely free-flowing reaction resin system. This significant improvement in properties is essentially due to the use of polymer nanoparticles 10, which also does not imply any disadvantage from an economic perspective, since the polymer nanoparticles 10 are used in comparatively low concentrations and therefore lead to a moderate increase in price of the potting compound 7. The improvement in flow behavior by the use of polymer nanoparticles 10 also offers the possibility of increasing the overall filler content of the supporting matrix 8 and thus optimizing the property profile while reducing overall costs. The use of nanoparticles (e.g., polymer nanoparticles 10) reduces or eliminates disadvantageous filtration or sedimentation effects. The nanoparticles reach all spaces together with the supporting matrix 8 and are distributed there largely homogeneously.

The table below contains various characteristic values of cured test specimens (reference objects) shown in the second column from the right under the heading "A", formed from a potting compound including a modified epoxy resin based on bisphenol A as the resin component of the supporting matrix containing 66% by weight of microparticular silicon oxide ($SiO_2$) modified with surface silanization. The potting compound has an average particle size of D50=20 µm. The characteristic values of cured test specimens are compared to characteristic values of test specimens formed from an exemplary composite of a potting compound shown in the right-hand column under the heading "B". The supporting matrix of the potting compound includes a modified epoxy resin based on bisphenol A as the resin component, yet includes 52% by weight of microparticular silicon oxide ($SiO_2$), since a proportion has been replaced by polymer nanoparticles in the form of spherical core-shell nanoparticles based on polybutadiene with a particle size of ≤100 nm. The flame retardant aluminum oxide trihydrate $Al(OH)_3$ (52% by weight), abbreviated to ATH, has an average particle size of D50=20 μm, so that the potting compound or the test specimens produced from the potting compound have an overall filler content of approximately 66% by weight.

A modified anhydride hardener based on methylhexahydrophthalic acid anhydride was used as the hardener component reacting with the resin component of the respective potting compound. The curing reaction of the reference and test specimens ran in a two-stage curing process, in which curing was carried out at 80° C. for 8 hours in the first stage and at 140° C. for 10 hours in the second stage. A tertiary amine was additionally used as an accelerator.

Different measurements were carried out on the basis of or in accordance with ISO, DIN or ASTM standards. The second column from the left shows the sample geometry used in the respective measurements. Standard deviations from the measured values were determined where possible. The measurements were carried out down to the measurements of viscoelastic properties (e.g., of the mechanical loss factor tan δ, the storage modulus E' and the loss modulus E" at 25° C.).

The measurements of the coefficient of linear thermal expansion a and of the glass transition temperature $T_G$ resulted in no significant differences between the reference samples and the test specimens formed from the potting compound. The same essentially applies taking into account the error values for the modulus of elasticity determined from the flexural test, the flexural strength and the impact strength (unnotched).

The situation is different for the measurements relating to the viscoelastic properties of the reference samples and of the test specimens, where an increase by almost a factor of 2 is shown in the mechanical loss factor tan δ of the test specimens produced from the potting compound compared to the reference objects. The measurements were carried out at the corresponding glass transition temperature. This measurement for the test specimens from the potting compound containing 1.5% polymer nanoparticles by weight and 12.3% flame retardant by weight is $4.12 \times 10^{-2}$, and for the reference objects from the potting compound including only microparticles, this measurement is $2.66 \times 10^{-2}$.

The measurements from tensile testing (e.g., relating to the modulus of elasticity from tensile testing and the tensile strength) produce lower values for the test specimens from the potting compound.

| Molding material characteristic | Sample geometry | A<br>66% μ-$SiO_2$ (μ-filler) | B<br>1.5% polymer-nano +<br>12.3% ATH +<br>52% μ-$SiO_2$ |
|---|---|---|---|
| Thermal linear coefficient of expansion α [ppm] (ISO 11359-2) | 3 × 3 × 4 mm | 34 | 35 |
| Glass transition $T_G$ [° C.] (ISO 11359-2) | 3 × 3 × 4 mm | 103 | 102 |
| Elasticity modulus E from flexural test [MPa] (DIN EN ISO 178) 0.5 mm/min | 10 mm × 15 mm × 125 mm | 8747 ± 511 | 8617 ± 266 |
| Flexural strength [MPa] (DIN EN ISO 178) 0.5 mm/min | 10 mm × 15 mm × 125 mm | 121 ± 9.2 | 110 ± 6.5 |
| Impact strength, unnotched [$kJ/m^2$] × 125 mm (DIN EN ISO 179) | 10 mm × 15 mm × 125 mm | 12 ± 1.2 | 10 ± 3.1 |
| Mechanical loss factor tan $δ_{mech}$ [—] at $T_G$ (DIN 65583) | 10 mm × 15 mm × 125 mm | $2.66 \cdot 10^{-2}$ | $4.12 \cdot 10^{-2}$ |
| Storage modulus E' [MPa] (DIN 65583) | 10 mm × 15 mm × 125 mm | 8639 | 7512 |
| Loss modulus E" [MPa] (DIN 65583) | 10 mm × 15 mm × 125 mm | 230 | 310 |
| Elasticity modulus from tensile test [MPa] (DIN EN ISO 527-2) | 10 mm × 15 mm × 125 mm | 12543 ± 564 | 10752 ± 247 |
| Tensile strength [MPa] (DIN EN ISO 527-2) | 10 mm × 15 mm × 125 mm | 76.5 ± 4.9 | 64.5 ± 6.1 |
| Critical stress intensity factor $K_{Ic}$ [MPa√m] (based on ASTM E 399, Double Torsion) | 80 mm × 40 mm × 4 mm centric V-notch 60° | 1.90 ± 0.04 | 2.38 ± 0.05 |
| Critical fracture energy $G_{Ic}$ [$J/m^2$] (based on ASTM E 399, Double Torsion | 80 mm × 40 mm × 4 mm centric V-notch 60° | 337 ± 19 | 680 ± 31 |
| Flammability (UL 94) | | V-1 (12 mm) | V-0 (12 mm) |

The critical stress intensity factor $K_{Ic}$ and, for example, the critical fracture energy $G_{Ic}$ are improved. For the critical fracture energy $G_{Ic}$, the test specimen from the potting compound, measuring approximately 680 J/m², is twice as high compared to the reference objects.

The parameters relating to flame retardance and/or flammability of the test specimens produced from the potting compound also improved at UL 94 V-0. The reference objects are categorized according to UL 94 V-1.

Figure 2:
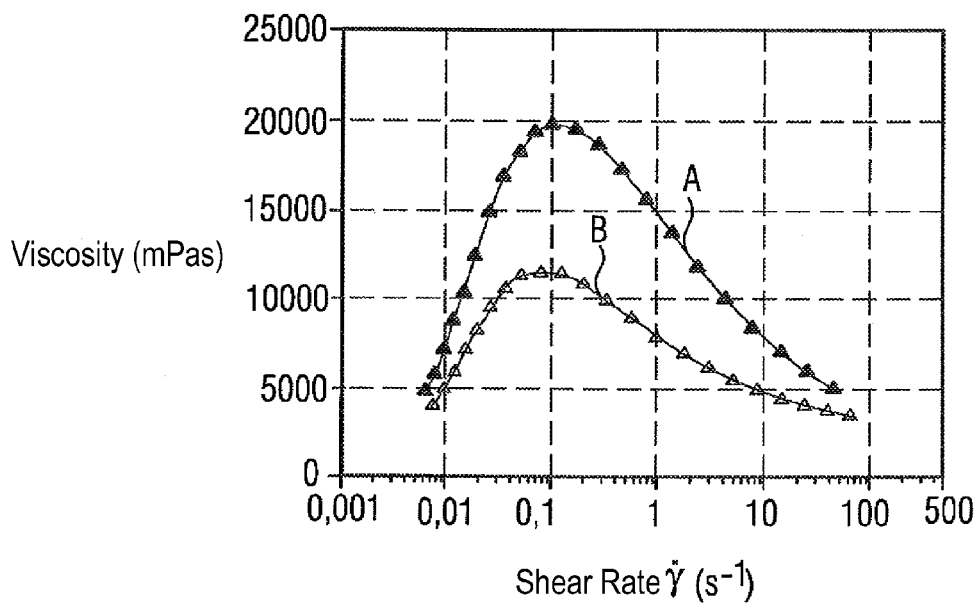
FIG. 2 is a diagram showing the viscosity gradient over the shear rate of one embodiment of a potting compound B and of a normal potting compound A including microparticular fillers.

FIG. 2 is a diagram showing the flow behavior of one embodiment of a potting compound, including 52% by weight of microparticular silicon oxide, 12.3% by weight of aluminum oxide trihydrate and 1.5% by weight of polymer nanoparticles (white symbols) and a potting compound including 53.5% by weight of microparticular silicon oxide and 12.3% by weight of aluminum oxide trihydrate (black symbols). Both potting compounds have an overall filler content of 65.5% by weight. Viscosity η is plotted on the coordinate in mPas. The abscissa describes the shear rate in s⁻¹ in a shear rate range from 0.001 to 500 with logarithmic plotting. The viscosity may be significantly reduced by more than 30% in the measurement range from 0.01 to 30 s⁻¹ (e.g., in a wide range) by the addition of polymer nanoparticles.

The two flow curves essentially show a similar course rising from a shear rate at 0.01 s⁻¹ to a peak at around 0.1 s⁻¹ and thereafter falling as the shear rate increases. The measured temperature was 50° C., and the measurements were carried out using a cylinder-beaker set up according to Searle, DIN 53019.

Because of the significantly better flow behavior of the potting compound, the proportion of inorganic microfillers may be increased in order to compensate for the reduction in the modulus of elasticity from tensile testing or in tensile strength, as identified in the table.

Increasing the filler content at the same time reduces the heat conductivity of the molding material and reduces the coefficient of expansion.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A magnetic resonance imaging compatible flame retardant potting compound suitable in potting an electronic gradient coil component, the potting compound comprising:
   a supporting matrix;
   a first filler comprising polymer nanoparticles;
   a second filler comprising an inorganic material; and
   a third filler that is used as a flame retardant and comprises Al(OH)₃, Mg(OH)₂, Sb₂O₃, brominated compounds, chlorinated compounds, halogenated compounds, halogen-free organophosphorous compounds, or a combination thereof
   wherein the first filler, the second filler, and the third filler are introduced into the supporting matrix, such that the potting compound is magnetic resonance imaging compatible, crack-resistant, flame retardant, and suitable in potting the electronic gradient coil component.

2. The magnetic resonance imaging compatible flame retardant potting compound as claimed in claim 1, wherein the inorganic material comprises SiO2, Al2O3, AlN, CaMg(CO3)2, TiO2, BN, Fe2O3, Fe3O4, ZnO, SiC, synthetic ceramics, zeolites, chalk, Mg3Si4O10(OH)2, CaSiO3, purely carbon-based particles, or a combination thereof.

3. The magnetic resonance imaging compatible flame retardant potting compound as claimed in claim 1, wherein the polymer nanoparticles are formed from or comprise polybutadiene, polystyrene, polysilane, polysiloxane, elastomers, thermoplastics, hybrid materials, or a combination thereof.

4. The magnetic resonance imaging compatible flame retardant potting compound as claimed in claim 1, wherein at least a proportion of the inorganic material comprises nanoparticles.

5. The magnetic resonance imaging compatible flame retardant potting compound as claimed in claim 1, wherein at potting compound as claimed in claim 1, wherein the polymer nanoparticles are unmixed from one material or are core-shell particles.

6. The magnetic resonance imaging compatible flame retardant potting compound as claimed in claim 1, wherein the polymer nanoparticles, the inorganic material, or the polymer nanoparticles and the inorganic material have a surface functionalization.

7. The magnetic resonance imaging compatible flame retardant potting compound as claimed in claim 1, wherein an average diameter of the polymer nanoparticles is ≤1000 nm.

8. The magnetic resonance imaging compatible flame retardant coil potting compound as claimed in claim 1, wherein the content of the polymer nanoparticles is ≤20% by weight, and the content of materials used as the flame retardant is ≤80% by weight.

9. The magnetic resonance imaging compatible flame retardant potting compound as claimed in claim 1, wherein the electronic gradient coil component comprises a large-volume gradient coil.

10. The magnetic resonance imaging compatible flame retardant potting compound as claimed in claim 9, wherein the large-volume coil comprises a gradient coil of a magnetic resonance device.

11. The magnetic resonance imaging compatible flame retardant potting compound as claimed in claim 5, wherein the inorganic material is unmixed from the one material or the core-shell particles.

12. The magnetic resonance imaging compatible flame retardant potting compound as claimed in claim 6, wherein the polymer nanoparticles, the inorganic material, or the polymer nanoparticles and the inorganic material have a surface functionalization using salinization.

13. The magnetic resonance imaging compatible flame retardant potting compound as claimed in claim 7, wherein the average diameter of the polymer nanoparticles is ≤100 nm.

14. The magnetic resonance imaging compatible flame retardant potting compound as claimed in claim 7, wherein the average diameter within the inorganic material is ≤100 nm.

15. The magnetic resonance imaging compatible flame retardant potting compound as claimed in claim 8, wherein the content of polymer nanoparticles is ≤10% by weight, and the content of the materials used as the flame retardant is ≤30% by weight.

16. The magnetic resonance imaging compatible flame retardant potting compound as claimed in claim 1, wherein the supporting matrix comprises a reaction resin.

17. The magnetic resonance imaging compatible flame retardant potting compound as claimed in claim 16, wherein the reaction resin is a modified epoxy resin based on bisphenol.

18. An electronic gradient coil component, wherein the electronic gradient coil component is potted using a magnetic resonance imaging compatible flame retardant potting compound, the magnetic resonance imaging compatible flame retardant potting compound comprising:
- a supporting matrix;
- a first filler comprising polymer nanoparticles;
- a second filler comprising an inorganic material; and
- a third filler that is used as a flame retardant and comprises $Al(OH)_3$, $Mg(OH)_2$, $Sb_2O_3$, brominated compounds, chlorinated compounds, halogenated compounds, halogen-free organophosphorous compounds, or a combination thereof
- wherein the first filler, the second filler, and the third filler are introduced into the supporting matrix, such that the potting compound is magnetic resonance imaging compatible, crack-resistant flame retardant, and suitable for potting the electronic gradient coil component.

19. The electronic gradient coil component as claimed in claim 18, wherein the inorganic material comprises SiO2, Al2O3, AlN, CaMg(CO3)2, TiO2, BN, Fe2O3, Fe3O4, ZnO, SiC, synthetic ceramics, zeolites, chalk, Mg3Si4O10(OH)2, CaSiO3, purely carbon-based particles, or a combination thereof.

20. The electronic gradient coil component as claimed in claim 18, wherein the polymer nanoparticles are formed from or comprise polybutadiene, polystyrene, polysilane, polysiloxane, elastomers, thermoplastics, hybrid materials, or a combination thereof.

21. The electronic gradient coil component as claimed in claim 18, wherein at least a proportion of the inorganic material comprises nanoparticles.

22. The electronic gradient coil component as claimed in claim 18, wherein the polymer nanoparticles are unmixed from one material or are core-shell particles.

* * * * *